(12) United States Patent
Grosso et al.

(10) Patent No.: US 11,112,692 B2
(45) Date of Patent: Sep. 7, 2021

(54) MICROTRANSFER MOLDING PROCESS AND PATTERNED SUBSTRATE OBTAINABLE THEREFROM

(71) Applicants: UNIVERSITE D'AIX-MARSEILLE, Marseilles (FR); CENTRE NATIONAL DE LA RECHERCHE SCIENTIFIQUE, Paris (FR); UNIVERSITE DE TOULON, La Garde (FR)

(72) Inventors: David Grosso, Allauch (FR); Thomas Bottein, Téteghem (FR)

( * ) Notice: Subject to any disclaimer, the term of this patent is extended or adjusted under 35 U.S.C. 154(b) by 0 days.

(21) Appl. No.: 16/623,152

(22) PCT Filed: Jun. 8, 2018

(86) PCT No.: PCT/EP2018/065197
§ 371 (c)(1),
(2) Date: Dec. 16, 2019

(87) PCT Pub. No.: WO2019/001934
PCT Pub. Date: Jan. 3, 2019

(65) Prior Publication Data
US 2020/0174363 A1     Jun. 4, 2020

(30) Foreign Application Priority Data
Jun. 29, 2017  (EP) .................................... 17305823

(51) Int. Cl.
*G03F 7/00* (2006.01)
(52) U.S. Cl.
CPC ................. *G03F 7/0002* (2013.01)

(58) Field of Classification Search
CPC .................................................... G03F 7/0002
See application file for complete search history.

(56) References Cited

U.S. PATENT DOCUMENTS 6,355,198 B1 * 3/2002 Kim ..................... B01J 19/0046
264/259
2009/0026658 A1    1/2009 Hosoda et al.
(Continued)

OTHER PUBLICATIONS

Dalstein et al., "Nanoimprinted, submicrometric, MOF-based 2D photonic structures: toward easy selective vapors sensing by a smartphone camera," Adv Funct Mater. 26(1): 81-90 (2016).
(Continued)

*Primary Examiner* — Nathan H Empie
(74) *Attorney, Agent, or Firm* — Clark & Elbing LLP

(57) ABSTRACT

Microtransfer molding process and patterned substrate obtainable therefrom The present invention pertains to the field of nanoimprint lithography (NIL) processes and more specifically to a MicroTransfer Molding process used for providing a sol-gel patterned layer on a substrate without any residual layer. The process comprises the following successive steps: (a) impregnating a soft mold with a sol-gel layer coated on a first substrate, under conditions of a relative solvent pressure adjusted such that the layer swells by vapor absorption between 10 and 60% vol., so as to fill the mold under the action of capillary forces, (b) removing the first substrate, (c) if needed, equilibrating the gel within the mold cavities, under a relative solvent pressure between 0 and 95%, in order to allow it to swell, (d) applying the swollen gel onto a second substrate to be patterned, (e) thermally treating this assembly so as to rigidify the gel, (f) removing the mold, and (g) curing the gel into a ceramic, thus forming a patterned substrate.

15 Claims, 1 Drawing Sheet

(56) References Cited

U.S. PATENT DOCUMENTS

| | | | |
|---|---|---|---|
| 2009/0098340 A1 | 4/2009 | Campos et al. | |
| 2010/0109201 A1 | 5/2010 | Fletcher et al. | |
| 2011/0148008 A1* | 6/2011 | Guo | B82Y 10/00 264/483 |
| 2012/0258292 A1* | 10/2012 | Lenhert | G01N 21/47 428/201 |
| 2012/0306122 A1* | 12/2012 | Hoshino | B29C 33/44 264/446 |
| 2013/0078796 A1 | 3/2013 | Ganesan et al. | |
| 2016/0214312 A1* | 7/2016 | Hirano | G03F 7/0002 |
| 2020/0218147 A1 | 7/2020 | Grosso et al. | |

OTHER PUBLICATIONS

International Search Report and Written Opinion for International Patent Application No. PCT/EP2018/065197, dated Jul. 11, 2018 (8 pages).

Kothari et al., "Direct patterning of robust one-dimensional, two-dimensional, and three-dimensional crystalline metal oxide nanostructures using imprint lithography and nanoparticle dispersion inks," Chem Mater. 29(9): 3908-3918 (2017).

Radivo et al., "Patterning PEDOT:PSS and tailoring its electronic properties by water-vapour-assisted nanoimprint lithography," RSC Adv. 4(64): 34014-34025 (2014).

* cited by examiner

MICROTRANSFER MOLDING PROCESS AND PATTERNED SUBSTRATE OBTAINABLE THEREFROM

The present invention pertains to the field of nanoimprint lithography (NIL) processes and more specifically to a MicroTransfer Molding process used for providing a sol-gel patterned layer on a substrate without any residual layer.

BACKGROUND OF THE INVENTION

The submicrometric patterning of thin films is of great interest for use in microelectromechanical systems capable of sensing, actuation, information processing, optical waveguides, surface acoustic wave devices and holographic memories, inter alia. Soft lithography is a promising technique for this purpose, as it allows replicating masters at the nanoscale while coping with the practical demands of industrial applications with respect to high resolution, high throughput, low cost, large area, and patterning on non-flat and curved surface.

Soft lithography uses a soft elastomeric stamp (i.e. mold) replicated from a hard master, which is used to impart a defined pattern to a thin film on a substrate. The film may be obtained from a polymeric or sol-gel material. Various patterning techniques may be implemented so as to deposit the film material to the substrate only where desired in the final pattern. Among these techniques, mention can be made of:

embossing, which relies on the displacement of material—applied as a film on a substrate—by the protruding features of the mold which is forcefully applied onto the substrate. This technique requires proper dewetting of the solution from the substrate to allow the raised features of the mold to contact the substrate. Usually, there remains dried material around the edges of the stamp, that needs to be removed. This technique thus cannot be used for demanding applications and with brittle substrates.

Micromolding in Capillaries (MIMIC) and MicroTransfer Molding (µTM), which both rely on the filling and duplication of the three-dimensional topography of the stamp followed by the release of the elastomeric stamp to transfer the pattern solely to the substrate.

In MIMIC, the patterned surface of the stamp is placed down onto the substrate having a network of connected microcapillary channels having open ends through which the precursor solution enters the channels and fills them by capillary action. The permeability of the stamp to gases then permits drying of the solution. The stamp is then released, leaving the microstructures on the surface of the substrate. In addition to being time consuming, the main limitation of this technique is that the sol-gel material rarely fills the entire channel network, because of the volume shrinkage that occurs upon drying of the solution. In addition, all features cannot be reproduced since some, such as isolated cavities for instance, may not be accessible to the solution by capillarity. Topographical defects are thus observed.

µTM overcomes some of the drawbacks of MIMIC, in that it is faster and allows generating both isolated and interconnected structures. In µTM, a prepolymer or sol-gel precursor solution (or "ink") is deposited onto the recessed areas of the patterned side of the stamp, most commonly by spin casting. During the spin-coating step, the ink dries and it is pulled away from the walls of the recessed channels. To avoid incomplete filling of the mold recesses, a wetting solution is sometimes applied to the mold. However, in that case, excess material must be removed from the raised areas of the stamp, either by scraping or with a stream of nitrogen to avoid the formation of a residual layer. The stamp is then brought into contact with the substrate. The lower interfacial energy of the elastomer to the substrate enables the patterned material to remain on the surface as the stamp is peeled away. Any remaining bonds between the ink and the stamp must be broken during the stamping step by applying mechanical stress.

Similarly to the MIMIC technique, absent the above steps to avoid it, a thin residual layer of the material usually remains on top of the patterned areas, which connects the imprinted features and which may be removed by plasma etching (C. Fernandez-Sanchez, *Chem. Mater.* 2008, 20, 2662-2668). Complete pattern transfer to the substrate thus requires careful control of the process parameters, including the rheological properties of the solution in the case where sol-gel precursors are used. Since this remains a challenge, topographical distorsions are typically produced with the µTM technique when applied to sol-gel materials.

For instance, X. Zhao et al., *Adv. Mater.* 1996, 8, 837 report the patterning of discrete microstructures from sol-gel materials using µTM. It is mentioned that precursors for $SiO_2$ and $ZrO_2$ were filled in a mold. The mold was then applied onto a wafer and the gel was formed by heating on a hot plate. It was concluded that "µTM has limitations. Microstructures fabricated on a flat surface using µTM may have a thin film between polymeric features." The authors thus suggest removing this film by oxygen reactive ion etching (RIE). However, RIE is likely to modify the pattern shapes because of low selectivity and further adds cost to the overall process.

This limitation of µTM is confirmed by Kang, "*Fabrication of ceramic layer-by-layer infrared wavelength photonic band gap crystals*", Iowa State University, 2004, 68-75. The author reports experiments to pattern a sol-gel material by µTM. A silicone stamp was infiltrated with a titanium alkoxide precursor using two different infiltration techniques.

In the first variant, the infiltration step was carried out by spin-coating in a glove box with controlled atmosphere, then the sample was dried in a low humidity environment and further aged in a humidity chamber to complete the gelation of the precursor. The mold was removed by firing and the gel simultaneously cured. The author mentions that the silicone stamp had to be pressed with a 1.87-3.73N force to transfer the infilling material onto the substrate. This shows that demolding was not easy.

In the second variant, a drop of precursor was applied to the mold, then a flat PDMS block was applied to the drop to force the sol-gel precursor into the cavities of the mold and this assembly was dried while maintaining pressure onto the block. After removing the block, the sample was then fired as above. The author mentions that this infiltrating technique led to rough surfaces and produced residual material on top of the channels.

The present inventors have indeed confirmed experimentally that the spin-casting infiltration method does not result in proper filling of the mold cavities.

Finally, C. R. Martin et al., *Journal of Electroceramics*, 2004, 12, 53-68 report the sub-micrometric scale patterning of ceramic thin films using liquid sol-gel precursors. This paper also suggests that demolding is not easy and that pressure should be applied to the mold. It is concluded that "for the technique to be a viable alternative, further study on the pressing conditions with both sol-gels ( . . . ) is required to eliminate the major topographical distorsion that the technique produces."

These authors thus further confirm the limitations of the µTM technique as noted above.

Therefore, there remains the need to provide a simple solution to overcome the well-known drawbacks of µTM techniques applied to sol-gel materials, namely the presence of a residual layer and the difficulties in demolding the gel which results in poor transfer quality.

SUMMARY

The inventors have shown that the above need may be satisfied by performing a specific impregnation step of the stamp with the sol-gel solution and by adjusting solvent vapor pressure during the micromolding process. It is thus possible to precisely and completely fill the stamp cavities only and thus to obtain a pattern with high resolution.

This invention is thus directed to a process comprising the following successive steps:

(a) impregnating a soft mold provided with at least one cavity with a sol-gel layer coated on a first substrate, under conditions of a relative solvent pressure adjusted such that the layer swells by vapor absorption between 10 and 60% vol., so as to fill the mold under the action of capillary forces, (b) removing the first substrate, (c) if needed, equilibrating the gel within the mold cavities, under a relative solvent pressure between 0 and 95%, in order to allow it to swell and thus entirely fill said at least one cavity, (d) applying the swollen gel onto a second substrate to be patterned, (e) thermally treating this assembly so as to rigidify the gel, (f) removing the mold, and (g) curing the gel into a ceramic, thus forming a patterned substrate.

It also pertains to the patterned substrate obtainable by the above process and to the use of this patterned substrate for manufacturing devices for optical, photonic, electrical or biological applications.

DETAILED DESCRIPTION

Figure 1:
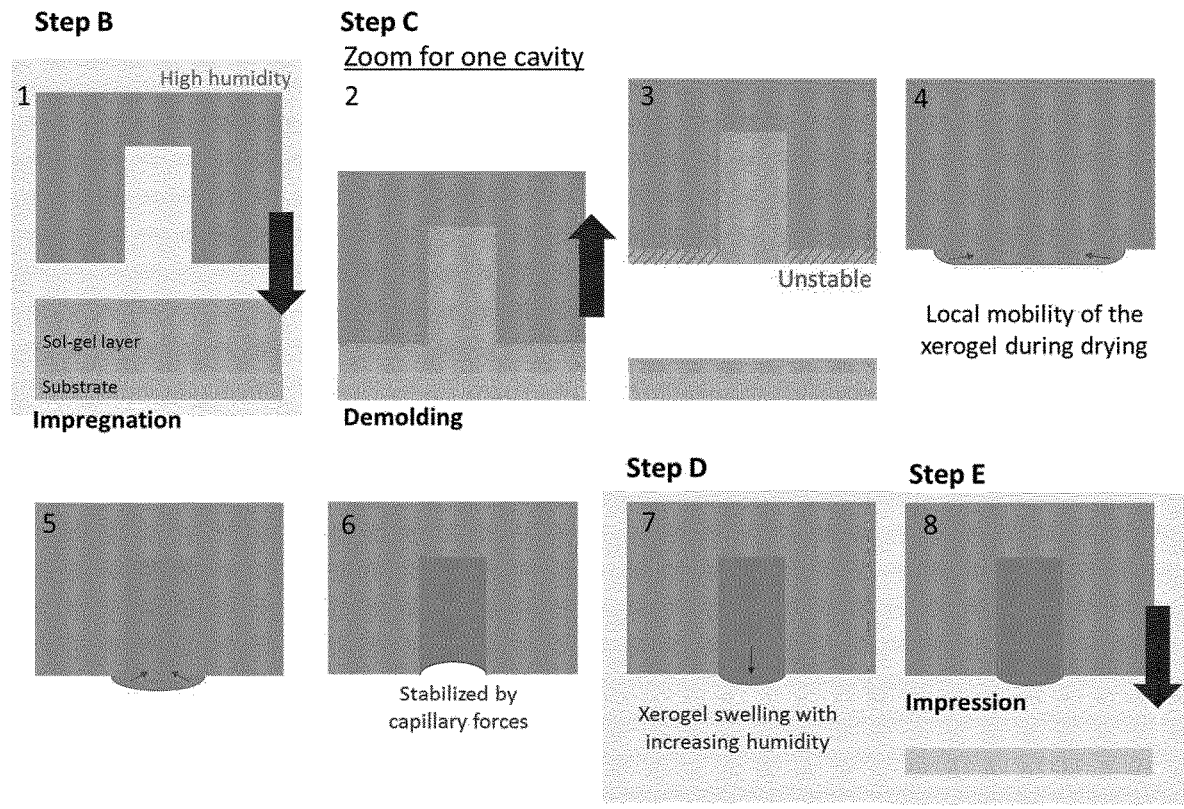
FIG. 1 represents the successive steps of the process according to this invention.

The process of this invention will now be detailed by reference to FIG. 1.

The nanoimprint lithography (NIL) process according to this invention is a soft NIL process which uses a soft stamp or mold.

This mold is typically obtained as a negative copy from a master template. The master template itself may be firstly fabricated from silicon or any other suitable material such as glass, metal oxide(s), polymers, hybrid materials and composite materials. It may be manufactured by electron beam lithography (EBL), Focused Ion Beam lithography (FIB) or any other suitable patterning technology. Then, the surface of the master may be treated to form an anti-adhesive layer thereon. The liquid mold material may then be spin coated or casted into the master template to duplicate a patterning layer. The material is usually degassed in a low pressure vacuum chamber. Subsequently, a backplane or a flexible layer may be bonded to the patterned layer. Thermal or UV curing is then generally performed in order to reduce roughness and to avoid a build-up of tension because of thermal shrinkage. The replicated mold is left to cool to room temperature and carefully peeled off from the master template.

Examples of materials that may be used for the manufacture of the mold are silicone elastomers (crosslinked polysiloxanes) that may be obtained by mixing a polysiloxane bearing reactive (such as hydride or vinyl) groups with a crosslinking silicone oligomer. Such molds are usually referred to as "PDMS molds". Other materials that may be used for the manufacture of the soft mold are fluorinated polymers, such as perfluoropolyether (PFPE) and its derivatives, including HPFPE which is a copolymer resin of a perfluoropolyether (PFPE) and a hyperbranched polymer (HP), acryloxy PFPE (denoted as a-PFPE) or a-,w-methacryloxy functionalized PFPE (PFPE-DMA); and tetrafluoroethylene and its derivatives, including ETFE (which is a copolymer of ethylene and tetrafluoroethylene) and copolymers of 2,2-bistrifluoromethyl-4,5-difluoro-1,3-dioxole and tetrafluoroethylene. Other suitable materials may be selected from polyvinylpyrrolidone (PVP), polylactic acid (PLA) and polyetherimide (PEI), for instance. Silicone elastomers are preferred for use in this invention.

In the process of this invention, the above mold is impregnated with a sol-gel layer formed from a solution of metal or metalloid oxide precursor(s).

The expression "metal oxide precursor(s)" refers to any metal oxide precursor, metalloid oxide precursor or combination thereof, which is conventionally used in sol-gel processes. The precursors may for instance be selected from the group consisting of inorganic salts, organics salts or alkoxides of at least one metal or metalloid or of a combination of at least one metal with at least one metalloid. Examples of inorganic salts are halides (fluorides, chlorides, bromides or iodides, especially chlorides), oxychlorides and nitrates. Organic salts may be selected from oxalates and acetates, for instance, while alkoxides are typically of formula $(RO)_n M$ where M denotes the metal or metalloid, n represents the number of ligands linked to M which corresponds to the valency of M and R represents a linear or branched alkyl chain having from 1 to 10 carbon atoms or a phenyl group; organometallic compounds of formula $X_y R^1_z M$ wherein M represents a metal or metalloid, X represents a hydrolysable group chosen from halogen, acrylate, acetoxy, acyl or OR' group where R' is a linear or branched alkyl group comprising from 1 to 10 carbon atoms or a phenyl group, $R^1$ represents a non-hydrolysable group selected from optionally perfluorinated linear or branched alkyl groups comprising from 1 to 10 carbon atoms or a phenyl group, and y and z are integers chosen so that y+z is equal to the valency of M. The metals may be selected from titanium, hafnium, zirconium, aluminum, copper, iron, scandium, vanadium, chromium, manganese, cobalt, nickel, copper, yttrium, niobium, molybdenum, technetium, ruthenium, rhodium, palladium, silver, tantalum, tungsten, rhenium, osmium, iridium, platinum, gold, rutherfordium, dubnium, seaborgium, bohrium, hassium, copernicium, cerium, erbium, europium, gadolinium, holmium, lanthanum, lutetium, neodymium, praseodymium, promethium, samarium, scandium, terbium, thulium, ytterbium, yttrium and their mixtures, whereas suitable metalloids include for instance silicon, selenium and tellurium. Examples of silicon precursors are tetraethoxysilane (TEOS), tetramethoxysilane (TMOS), tetrapropoxysilane, methyltriethoxysilane, dimethyldimethoxysilane, allyltrimethoxysilane, propyltriethoxysilane, phenyltriethoxysilane, 1,4-bis(triethoxysilyl)benzene, vinyltriethoxysilane, phenylaminomethyltriethoxysilane (PAMS), triethoxysilane, triethoxy(octyl)silane, methyltrimethoxysilane, phenyltrimethoxysilane and methyltriisopropoxysilane, preferably tetraethoxysilane (TEOS); examples of titanium precursors are $TiCl_4$, $Ti(OPr)_4$, $Ti(NO_3)_4$, $Ti(SO_4)_2$ and titanium acetate. The metal or metalloid precursors may further be present in a hydrated form. Precursors of different metals or metalloids or precursors of a combination of at least one metal with at least one metalloid may be used, to obtain ceramics in the form of complex oxides with a defined stoechiometry.

To form the solution used in this invention, the precursors are typically combined with a solvent selected from water, mono- or dihydric alcohols, such as methanol, ethanol, n-propanol, ethylene glycol, propylene glycol or a mixture thereof. Water combined with organic solvent(s) is generally used in the case of inorganic precursors and organometallic precursors. In the former situation, ethanol is preferably present in the solution in order to improve the wetting of the substrate, disperse the precursors and reduce the kinetics of their hydrolysis to avoid crosslinking. The solution may additionally comprise a catalyst, which may be selected from basic catalysts (such as $NH_3$) and acidic catalysts, preferably a small and volatile acid (such as acetic acid or hydrochloric acid), less preferably a non-volatile acid (such as nitric acid). It may further comprise one or more polymers, intended for instance to form mesopores in the metal or metalloid oxide film or to improve its homogeneity, such as amphiphilic block copolymers. The solution may also comprise surfactants, such as a cationic surfactant, to stabilize the colloidal solution or "sol" formed after hydrolysis and polymerization of the precursors. Chelating agents may further be provided in the solution, although not needed according to this invention. It has indeed been shown that the mobility of the sol-gel film is high enough according to the process provided herein, such that it does not need to be adjusted by chelating agents.

This solution is applied to a first substrate by any appropriate means, for instance by dip coating, spray coating or spin coating, more specifically by dip coating, so as to form a layer having a thickness from 5 nm to several microns, preferably from 20 to 200 nm. The substrate onto which the sol-gel layer is deposited may be selected from glass, metal or polymeric substrates, for instance. Examples of polymers that may be used as the substrate include polyimide, polycarbonate and polyester (such as polymethyl methacrylate). The film thickness may be adjusted by controlling the deposition conditions (dip-coating withdrawal rate; spin-coating revolution rate) and the solution viscosity and concentration.

The coating of the first substrate may be performed under conditions necessary to obtain uniform layer thickness, typically less than 10% thickness variation. This can be achieved by applying the proper relative vapor pressure during deposition. For $TiO_2$-based sol-gel solutions, for instance, a low relative solvent pressure, preferably a low relative water pressure, for instance between 0 and 70%, preferably between 0 and 40% may be used. The solvent (water) relative vapor pressure is obtained by flowing a mixture of dry air and air saturated with the selected solvent vapor with the help of mass flow controllers. A flow composed of 50% of dry air and 50% of air which is saturated in solvent vapor yields a relative solvent vapor pressure of 50%. The saturated air is typically obtained by bubbling dry air into the liquid phase of the solvent vapor. The obtained relative solvent vapor pressure is then measured by adequate means, for instance by a sensor.

Examples of solvents that may be used for this purpose are selected from the group consisting of water, methanol, ethanol, isopropanol, butanol, acetone, THF, toluene and their mixtures, preferably the solvent is water.

A gel is formed from the metal or metalloid oxide precursors to obtain a gel film coated on the first substrate. Said gel is formed by hydrolysis and polymerization of said precursors. Hydrolysis may start spontaneously in case the sol-gel solution comprises water or when the metal or metalloid precursors are in the form or hydrates. Polymerization may be delayed in case the solution comprises an acidic catalyst. In any case, the film or layer formed on the substrate at this stage of the process should be left flexible enough to be able to fill the recesses of the mold which is contacted therewith in the next step of the process. The flexibility (fluidity) of the gel layer is controlled by adjusting the relative vapor pressure in solvent (for instance water) in the chamber. The flexible gel layer tends to equilibrate with the composition of the atmosphere and will naturally absorb volatile species. It was shown that for $TiO_2$, $Al_2O_3$, $ZrO_2$ and $SiO_2$, the ideal fluidity for soft-NIL processing is obtained when adjusting the relative humidity such that the layer swells in its volume by a factor of 30% more or less 10% by up-taking water in this particular case. The type of vapor can easily be varied to yield similar results. It is expected that this optimal degree of swelling also applies to other sol-gel systems and the applied relative vapor pressure depends on the type of sol-gel and more precisely its hygroscopicity when in the state of being non-rigid.

The process of this invention is characterized in that it comprises a step of impregnating the soft mold described above with this sol-gel layer deposited on the first substrate, instead of depositing the sol-gel layer by spin-coating as in conventional Micro Transfer Molding processes. Impregnation may be conducted by merely contacting the sol-gel layer deposited on the substrate with the mold, such that the open cavities of the mold face the sol-gel layer, for a time between a few seconds and 10 minutes, preferably between 30 seconds and 2 minutes. Contacting is usually performed without applying pressure to the mold or to the substrate. The mold has typically been degassed a few minutes before the impregnation step and its porosity is thus empty enough to act as a "sponge" which pumps the solvent contained into the sol-gel film while the resist sol-gel is sucked inside the protrusions of the mold. There is thus no need to apply high pressure to the mold during impregnation. Specifically, according to a preferred embodiment of this invention, the pressure applied to the mold during the impregnation step described above is that of the weight of the mold only (i.e. typically less than 10 $g/cm^2$).

It has been shown by the present inventors that the sol-gel solution (xerogel) could not fill the cavities of the mold homogeneously when applied by spin coating or any other direct means. This was because a direct impregnation of the mold by a diluted sol-gel solution followed by its evaporation led to local accumulation of the material in an inhomogeneous and uncontrolled manner.

Importantly, to achieve complete filling of the cavities, this impregnating step is conducted under conditions, namely under a controlled relative solvent pressure, so as to fill the mold under the action of capillary forces. The amount of sol-gel material applied to the mold can be easily adjusted by varying the thickness of the sol-gel layer deposited on the first substrate in the former step. It is thus possible to apply the same amount of xerogel to each cavity.

The relative solvent pressure is adjusted during the impregnation step, such that the layer swells by vapor absorption between 10 and 60% vol, ideally between 15% and 45% vol, so as to optimally fill the mold under the action of capillary forces. Examples of solvents that may be used for this purpose are selected from the group consisting of water, methanol, ethanol, isopropanol, butanol, acetone, THF, toluene and their mixtures, preferably the solvent is water.

In the next step of the process according to this invention, the filled mold is removed from the substrate. The xerogel is then allowed to dry for a time between 5 seconds and 10 minutes and preferably between 10 seconds and 2 minutes. During that time, because of the instability of the xerogel, the material staying outside the cavities dewets from the surface and fills the surrounding cavities. The xerogel then shrinks inside the cavities where it remains stabilized by capillary forces. Selective filling of the cavities is thus achieved and a final pattern without any residual layer may be obtained.

It is to be noted that the successive steps of impregnating the mold, followed by the removal of the mold and the drying of the gel may be repeated several times, depending on the depth of the cavities to be filled and/or if the patterns should be made of stacked layers of different metal oxides.

If needed, the gel within the mold cavities is then equilibrated under a relative solvent pressure in order to allow the gel to swell enough to protrude from the cavities. The relative solvent pressure needs to be tailored for each particular case and can vary from 0 to 95% relative solvent pressure, for example from 20 to 95%, for instance from 70 to 95% solvent pressure in the case where the solvent is water, in order to obtain the optimal degree of swelling. This is a key step of the process of this invention, since it not only allows the gel to completely fill the mold cavities, but also ensures proper demolding of the gel later on; even if the gel, before the above mentioned shrinkage, did not entirely fill the cavity. If the cavities are already filled before the said equilibrium, swelling of the gel from solvent might not be needed.

In the next step of the process, the swollen gel is applied onto a second substrate to be patterned, usually by merely contacting the structured surface of the mold with the second substrate. This substrate may be selected from those listed above, which were used in the first step of the process. However, the first and second substrates need not be the same. Contacting is performed without applying any pressure to the second substrate or to the mold.

This assembly is then thermally treated so as to further polymerize and condensate the metal oxide precursor(s) contained in the xerogel and to improve the adhesion between the xerogel and the second substrate, thus favoring a proper transfer of the pattern in the next step, without any cracks. The duration and temperature of this thermal treatment may be adjusted to any suitable range for obtaining a gelled film which displays preference adherence to the second substrate compared to the mold and sufficient rigidification to avoid collapsing of the pattern after unmolding. Depending on the constituents of the sol-gel solution, the treatment may for instance be performed at a temperature of from 25 to 200° C. for typically between 1 to 20 minutes, preferably at a temperature of between 50 and 150° C., more preferably between 60 and 120° C.

The mold is then removed to obtain a substrate coated with a patterned gel which may have started to solidify and this gel is further densified by curing so as to obtain a patterned metal or metalloid oxide material on said second substrate. This curing (or annealing) step results in a complete removal of the solvent present in the colloidal solution, of the solvent absorbed by the film and of the organic by-products generated by the precursors and of the polymer(s) that may be present in the sol-gel solution. The duration and temperature of this curing treatment may be adjusted to any suitable range, depending on the constituents of the colloidal solution, so as to obtain constant dimensions of the pattern and for instance from 200 to 800° C., usually from 300 to 500° C. A patterned substrate without any residual layer between the metal oxide structures is thus obtained.

The patterned substrate thus obtained may be used in various applications and in particular for manufacturing devices for optical, photonic, electrical or biological applications. Among such applications, mention can be made of, for instance, solar cells for photovoltaic devices; photonic crystals for photonic crystal fibers, optical waveguides, laser emission or optical sensors; membranes; resonators; microstructures for protein patterning; anti-reflection coatings for optical devices; or photocatalysis.

The mold may then be reused to imprint other substrates. If needed, the mold may first be freed from any xerogel remaining on its surface by contacting it with a suitable structured substrate.

The above process may be automatized to imprint large substrate areas and apply various patterns, with different morphologies and/or compositions, side by side on a number of different surfaces (such as curved, hydrophobic or porous surfaces). It can also be used to stack various patterns with different compositions and morphologies directly or after embedding each layer of patterns in a sol-gel film in order to make a 3D network.

Figure 2:
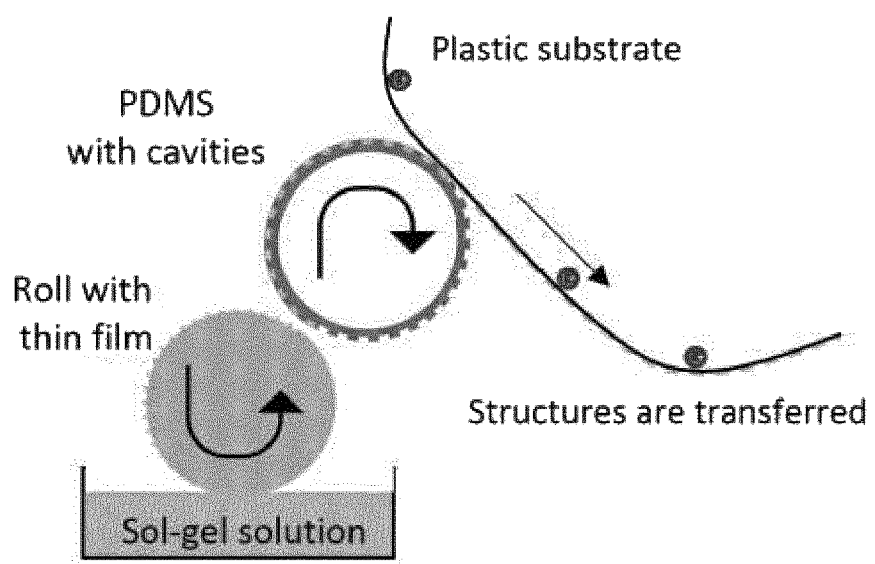
FIG. 2 illustrates a continuous process according to this invention.

As shown on FIG. 2, the process of this invention may optionally be conducted continuously by means of a roll-to-roll device, wherein the sol-gel solution is transferred onto a first roll which is contacted with a second roll used as a stamp (such as a PDMS stamp) with cavities. The filled recesses of the second roll are then contacted with a substrate (such as a plastic substrate).

EXAMPLES

This invention will be better understood in light of the following examples which are given for illustrative purposes only and do not intend to limit the scope of the invention, which is defined by the attached claims.

Example 1

Microtransfer Molding of Diffraction Grids from a $TiO_2$ Sol-Gel

A master was manufactured by Focused Ion Beam lithography on a silicon wafer.

A negative of this master was then prepared by molding from a silicone elastomer (PDMS) material, such that the master conferred on the mold diffraction grids, i.e. cavities in the form of lines having a width having a width of $5\pm0.2$ μm, a length of 5 mm and a depth of $1200\pm100$ nm, distant from $2\pm0.2$ μm. To prepare the mold, the master was first immersed in an ethanoic solution of 0.05 M of $SiCl_2(CH_3)_2$ during 30 min, then withdrawn from the solution and abundantly rinsed with ethanol. The PDMS precursors (90% by weight Rhodorsil® RTV141A, 10% RTV141B) were mixed then poured onto the master. After degassing, the PDMS was annealed at 70° C. for 30 min and then demolded. The PDMS mold was degassed just before the replication step.

A sol-gel solution consisting of $TiCl_4$:EtOH:$H_2O$:Pluronic® F127 in a molar ratio of $1:40:7:2.10^{-4}$ was used to obtain a coating on a defatted glass slide (VWR®) by dip-coating in controlled chamber (T=22° C., RH=20%), under conditions allowing to obtain a film thickness of 100 nm±10 nm. Shortly after dip-coating, the glass slide was placed into a chamber with controlled atmosphere (RH=70%). The gas relative vapor pressure (in this case the relative humidity) was precisely controlled and maintained for 1 min to allow equilibrium of the xerogel layer, then the mold was applied onto the film without additional pressure and kept for 1 min under controlled humidity (70% RH) so as to fill the mold cavities. The filled mold was then removed from the glass substrate and placed under different controlled atmosphere (85% RH) for 1 minute. Finally, the mold was placed onto a defatted glass slide (VWR®) without any additional pressure. This assembly was heated to 70° C. for 5 min in a drying oven. After cooling, the mold was removed from the glass slide, leaving the sol-gel material on the latter. The imprinted glass slide was then thermally treated at 400° C. for 10 min, in order to crystallize $TiO_2$ into its anatase form.

The structures transferred onto the glass slide were analyzed with an electronic microscope. No residual layer was observed. Moreover, the structures were fully transferred and had an homogeneous aspect over several hundred microns.

In order to confirm that no residual layer was present, the above process was repeated on a silicon substrate with a similar sol-gel solution containing a 30% molar ratio of $CaCl_2$ (compared to $TiCl_4$). A $CaTiO_3$ pattern was thus obtained. Reactive Ion Etching (RIE) was then performed and the structures were analyzed by Atomic Force Microscopy. $CaTiO_3$ is very resistant to RIE and thus acts as a photoresist. Since etching was taking place at the rate known for silicon between the patterned structures while the structures resisted the etching, this experiment confirms that no residual layer was produced by the above process.

Example 2

Microtransfer Molding of Square Structures from a $TiO_2$ Sol-Gel onto a Glass Substrate A master was manufactured by Focused Ion Beam lithography on a silicon wafer.

A negative of this master was then prepared by molding from a silicone elastomer (PDMS) material, such that the master conferred on the mold square nanostructured cavities having a side dimension of 1.5, 2 and 2.5 µm and a depth of 800 and 1500 nm respectively over an area of 20×20 µm. To prepare the mold, the master was first immersed in an ethanoic solution of 0.05 M of $SiCl_2(CH_3)_2$ during 30 min, then withdrawn from the solution and abundantly rinsed with ethanol. The PDMS precursors (90% by weight Rhodorsil® RTV141A, 10% RTV141B) were mixed then poured onto the master. After degassing, the PDMS was annealed at 70° C. for 30 min and then demolded. The PDMS mold was degassed just before the replication step.

A sol-gel solution consisting of $TiCl_4$:EtOH:$H_2O$:Pluronic® F127 in a molar ratio of $1:40:7:2.10^{-4}$ was used to obtain a coating on a defatted glass slide (VWR®) by dip-coating in controlled chamber (T=22° C., RH=20%), under conditions allowing to obtain a film thickness of 40 nm±10 nm. Shortly after dip-coating, the glass slide was placed into a chamber with controlled atmosphere (RH=70%), The gas relative vapor pressure (in this case the relative humidity) was precisely controlled and maintained for 1 min to allow equilibrium of the xerogel layer, then the mold was applied onto the film without additional pressure and kept for 1 min under controlled humidity (70% RH) so as to fill the mold cavities. The filled mold was then removed from the glass substrate and placed under different controlled atmosphere (85% RH) for 1 minute. Finally, the mold was placed onto a defatted glass slide (VWR®) without any additional pressure. This assembly was heated to 70° C. for 5 min in a drying oven. After cooling, the mold was removed from the glass slide, leaving the sol-gel material on the latter. The imprinted glass slide was then thermally treated at 400° C. for 10 min, in order to crystallize $TiO_2$ into its anatase form.

The structures transferred onto the glass slide were analyzed with an electronic microscope. No residual layer was observed. Moreover, the pattern of the master was accurately replicated with an aspect ratio of the replicated structures similar to what is usually obtained by Soft-NIL processes.

Example 3

Microtransfer Molding of Square Structures from a $TiO_2$ Sol-Gel onto Stainless Steel The experiment described in Example 2 was reproduced using stainless steel as a substrate instead of glass. The pattern could be printed on this substrate, although the formation of a sol-gel layer on stainless steel is usually impossible due to the acidity of the sol-gel solution which results in an oxidation of the substrate. It is assumed that this can be achieved because the sol-gel material is already partially condensed when this layer is transferred onto the substrate and most of the hydrochloric acid present in the sol-gel solution has thus evaporated, according to the process of this invention. Therefore, any kind of substrate can be successfully printed with this invention.

Example 4

Microtransfer Molding of Square Structures from a $TiO_2$ Sol-Gel onto a Large Substrate The process as described in Example 2 was conducted with the same mold on a larger substrate. The patterns were repeated several times by contacting the same mold with the substrate without any intermediate treatment of the mold. It was shown that it was possible to form side-by-side structures and thus print a large substrate using a single mold of reduced dimensions.

Moreover, each printing step may require less than 2 min if optimized. Using a mold of 1 $cm^2$, it would possible to transfer 100 $cm^2$ within 3.5 h. The mold could be used afterwards as a master. When conducting this process with several stamps of different structures and several sources of sol-gel precursors, several structures of different compositions and morphologies could be stacked and/or placed side by side.

The invention claimed is:
1. Process comprising the following successive steps:
   (a) impregnating a soft mold provided with at least one cavity with a sol-gel layer coated on a first substrate, under conditions of a relative solvent pressure adjusted such that the layer swells by vapor absorption between 10 and 60% vol., so as to fill the mold under the action of capillary forces, (b) removing the first substrate, (c) if needed, equilibrating the gel within the at least one cavity, under a relative solvent pressure between 0 and 95%, in order to allow it to swell and thus entirely fill said at least one cavity, (d) applying the swollen gel onto a second substrate to be patterned, (e) thermally treating an assembly comprising the mold, the gel, and the second substrate so as to rigidify the gel, (f) removing the mold, and (g) curing the gel into a ceramic, thus forming a patterned substrate.

2. The process of claim 1, wherein the sol-gel is coated on the first substrate under conditions of relative solvent pressure between 0 and 70%.

3. The process of claim 2, wherein the sol-gel is coated by dip-coating.

4. The process of claim 1, wherein the solvent is selected from the group consisting of water, methanol, ethanol, isopropanol, butanol, acetone, THF, toluene and their mixtures.

5. The process according to claim 1, wherein the mold is manufactured from silicone elastomers, fluorinated polymers, polyvinylpyrrolidone (PVP), polylactic acid (PLA) and polyetherimide (PEI).

6. The process according to claim 1, wherein the thermal treatment in step (e) is performed at a temperature of from 25 to 200° C.

7. The process according to claim 1, wherein the relative solvent pressure in step (a) is adjusted such that the layer swells by vapor absorption between 15 and 45% vol.

8. The process according to claim 1, wherein the sol-gel layer is formed from a solution of metal or metalloid oxide precursor(s) selected from the group consisting of inorganic salts, organics salts or alkoxides of at least one metal or metalloid or of a combination of at least one metal with at least one metalloid, combined with a solvent selected from water, mono- or dihydric alcohols, or a mixture thereof.

9. The process of claim 8, wherein the mono- or dihydric alcohols are selected from the group consisting of methanol, ethanol, n-propanol, ethylene glycol, and propylene glycol.

10. The process according to claim 1, wherein the curing step (g) is performed at a temperature of from 200 to 800° C.

11. The process of claim 1, wherein the sol-gel is coated on the first substrate under conditions of relative solvent pressure between 0 and 40%.

12. The process of claim 1, wherein the solvent is water.

13. The process of claim 1, wherein the mold is manufactured from a silicone elastomer.

14. The process of claim 1, wherein the thermal treatment in step (e) is performed at a temperature of from 50 to 150° C.

15. The process of claim 1, wherein the curing step (g) is performed at a temperature of from 300 to 500° C.

* * * * *